United States Patent
Hanke

(10) Patent No.: US 7,122,400 B2
(45) Date of Patent: Oct. 17, 2006

(54) METHOD OF FABRICATING AN INTERCONNECTION FOR CHIP SANDWICH ARRANGEMENTS

(75) Inventor: André Hanke, Strausberg (DE)

(73) Assignee: Infineon Technologies AG, Munich (DE)

( * ) Notice: Subject to any disclaimer, the term of this patent is extended or adjusted under 35 U.S.C. 154(b) by 21 days.

(21) Appl. No.: 10/944,678

(22) Filed: Sep. 17, 2004

(65) Prior Publication Data

US 2005/0098883 A1    May 12, 2005

(30) Foreign Application Priority Data

Sep. 17, 2003   (DE)   ................ 103 43 257

(51) Int. Cl.
*H01L 21/48* (2006.01)
(52) U.S. Cl. .................. 438/107; 438/125; 29/874
(58) Field of Classification Search ............ None
See application file for complete search history.

(56) References Cited

U.S. PATENT DOCUMENTS

| | | | |
|---|---|---|---|
| 4,788,767 A * | 12/1988 | Desai et al. ............... 29/830 |
| 5,347,162 A | 9/1994 | Pasch |
| 5,468,681 A * | 11/1995 | Pasch ........................ 438/108 |
| 5,477,082 A | 12/1995 | Buckley, III et al. |
| 5,624,268 A * | 4/1997 | Maeda et al. ............... 439/66 |
| 5,719,749 A * | 2/1998 | Stopperan ................. 361/769 |
| 6,703,651 B1 | 3/2004 | Wörz et al. |
| 6,974,915 B1* | 12/2005 | Brodsky et al. ............ 174/260 |
| 2002/0030261 A1* | 3/2002 | Roida et al. ................ 257/685 |
| 2004/0038496 A1 | 2/2004 | Lee et al. |

FOREIGN PATENT DOCUMENTS

| | | | |
|---|---|---|---|
| JP | 09064382 A | * | 3/1997 |
| JP | 2000232198 A | * | 8/2000 |
| JP | 2001177049 A | * | 6/2001 |
| JP | 2002-164499 | | 6/2002 |
| KR | 2001068504 A | * | 7/2001 |
| WO | WO 02/09194 A1 | | 1/2002 |

OTHER PUBLICATIONS

Post, H-J, "Chip-Sandwich revolutioniert Halbleitertechnologie" (Chip-Sandwich) revolutionizes semiconductor technology), Infineon Galaxy, No. 6, Dec. 2002, p. 14.

* cited by examiner

*Primary Examiner*—Alonzo Chambliss
(74) *Attorney, Agent, or Firm*—Slater & Matsil, L.L.P.

(57) ABSTRACT

The invention relates to an interconnection for chip sandwich structures by means of which chips can be electrically and mechanically connected to one another face-to-face, and to a method for the production thereof. The invention is intended to create interconnections that can be produced more cost-effectively and more effectively. This is achieved by virtue of the fact that pin- or sleeve-shaped contact elements (3) are arranged between the chips (1, 2), which contact elements create an electrical and mechanical interconnection between the contact pads (4, 5) of the semiconductor chips (1, 2) and are soldered to the latter.

19 Claims, 2 Drawing Sheets

METHOD OF FABRICATING AN INTERCONNECTION FOR CHIP SANDWICH ARRANGEMENTS

This application claims priority to German Patent Application 103 43 257.4, which was filed Sep. 17, 2003, and is incorporated herein by reference.

TECHNICAL FIELD

The invention relates to an interconnection for chip sandwich structures, by means of which chips can be electrically and mechanically connected to one another face-to-face, and to a method for the production thereof.

BACKGROUND

It has been found that the demands for compact handheld products such as miniature PCs, portable navigation systems, databases, telephones etc. is constantly continually rising. These products require particularly small memories with a high storage capacity and must realize rising switching frequencies and power densities without any problems. In order to be able to meet these requirements, recently use has been made of so-called "chip sandwich constructions."

In the case of such chip sandwich constructions, chips at the wafer level are stacked to form a 3-D chip system and preferably contact-connected to one another by the production of wire bridges between the individual chips and planes. One example of this is disclosed in JP 2002164499 A and in U.S. Pat. No. 6,703,651, which is incorporated herein by reference. These customary wirings have the disadvantage of high losses and are therefore extremely unsuitable for chips of the new generation having high clock frequencies.

Furthermore, the wire bonding technology is technologically unsuitable for 3-D chip systems because the outlay for producing the wire bridges is considerable and the risk of short circuits between the wire bridges rises as the contact density increases.

In the meantime, chip sandwich structures have become known in which chips are stacked face-to-face, the production of the direct connections between the chips being relatively complicated. For this purpose, firstly a Cu layer having a thickness of approximately 5 µm is applied to the surfaces that are to be connected to one another. Afterwards, the Cu layer is patterned by means of the techniques of standard photolithography, the locations of the interconnections between the two chips being defined. Afterwards, a solder having an extremely small layer thickness of a few microns is applied and the two surfaces are subsequently pressed against one another and connected to one another under the action of temperature. (INFINEON Galaxy, No. 6, Dec. 2002, page 14 "Chip Sandwich revolutioniert Halbleitertechnologie" ["chip sandwich revolutionizes semiconductor technology"]).

In this way, it is possible to realize shorter interconnections between the chips, thereby enabling clock frequencies in excess of 200 GHz. However, the outlay for realizing these interconnections is considerable owing to the required photolithography.

It is thus necessary to develop a novel connection technology in order to be able to produce the interconnections between chip sandwich arrangements more cost-effectively and more effectively.

SUMMARY OF THE INVENTION

The invention is thus based on the object of avoiding disadvantages adherent to the prior art.

In one aspect, the invention achieves advantages by virtue of the fact that pin- or sleeve-shaped contact elements are arranged between the chips. These contact elements create an electrical and mechanical interconnection between the contact pads of the semiconductor chips and are soldered to the latter.

Preferably, the pin- or sleeve-shaped contact elements ensure a shortest possible connection between the chips and at the same time enable a mechanically fixed chip sandwich assembly to be produced. The contact elements can be produced entirely without photolithography.

In order to simplify the mounting, the contact elements are embedded in a flexible substrate, which may comprise a flexible polymer substrate, for example.

A further refinement of the invention provides for the contact elements to be arranged in the pitch of the contact pads in a manner similar to the FBGA structure of the chips that are to be contact-connected to one another.

In order to achieve a rewiring of the contact elements and/or to enable an electrical contact-connection to the peripheral units, e.g., printed circuit boards, it is furthermore provided that conductive tracks (e.g., copper) are embedded in the flexible polymer substrate, at least some of the contact elements being electrically connected to the tracks. The flexible polymer substrate with the Cu conductive tracks may thus be used as a flexible printed circuit board for electrical connection to external assemblies.

A particular refinement of the invention provides for the flexible substrate to be formed as a sacrificial layer. This means that the sacrificial layer may be removed after the completion of the chip sandwich.

A particular feature of the invention is to be seen in the fact that the contact elements may be arranged perpendicularly or else without any problems obliquely between the chips. This makes it possible to compensate for slight positional deviations of the contacts that are to be connected to one another.

In another aspect, the invention provides a method which is characterized in that microvias are introduced into a flexible substrate in the pitch of the bonding pads of the chips. The microvias are subsequently filled with an electrically conductive material. At least the walls of the microvias are coated and pin- or sleeve-shaped contact elements are formed.

This method for producing the contact elements can be realized extremely cost-effectively without any photolithography.

In a development of the invention, the flexible substrate is thinned by etching on both sides, so that the contact elements project from the flexible substrate on both sides.

The substrate may be thinned by means of a plasma etching that is selective with respect to the contact elements.

In a further refinement, the flexible substrate is removed by soldering after the production of the electrical and mechanical connection between the chips, in which case the interspace between the chips may subsequently be filled with a suitable corrosion-inhibiting material.

The interspace is advantageously filled by utilizing capillary forces.

A further refinement of the invention provides for the microvias to be introduced into the flexible substrate by means of photolithography in conjunction with plasma etching.

As an alternative, the microvias may also be introduced mechanically by stamping.

In a further advantageous development, the flexible substrate is a flexible printed circuit board whose conductive tracks (e.g., copper tracks) are contact-connected during the metalization of the microvias. This makes it possible, in a simple manner, to achieve a rewiring of the chip contacts and also to realize a connection to peripheral devices.

One particular advantage of the contact elements according to a preferred embodiment of the invention is to be seen in the fact that they can be produced with low outlay and with conventional technology, and that it is possible to dispense with the chemical deposition of copper, which may be replaced by means of an electrolytic direct metalization. The vias may be produced simultaneously simply by plasma etching.

BRIEF DESCRIPTION OF THE DRAWINGS

The invention will be explained in more detail below using an exemplary embodiment. In the associated drawings.

DETAILED DESCRIPTION OF ILLUSTRATIVE EMBODIMENTS

Figure 1:
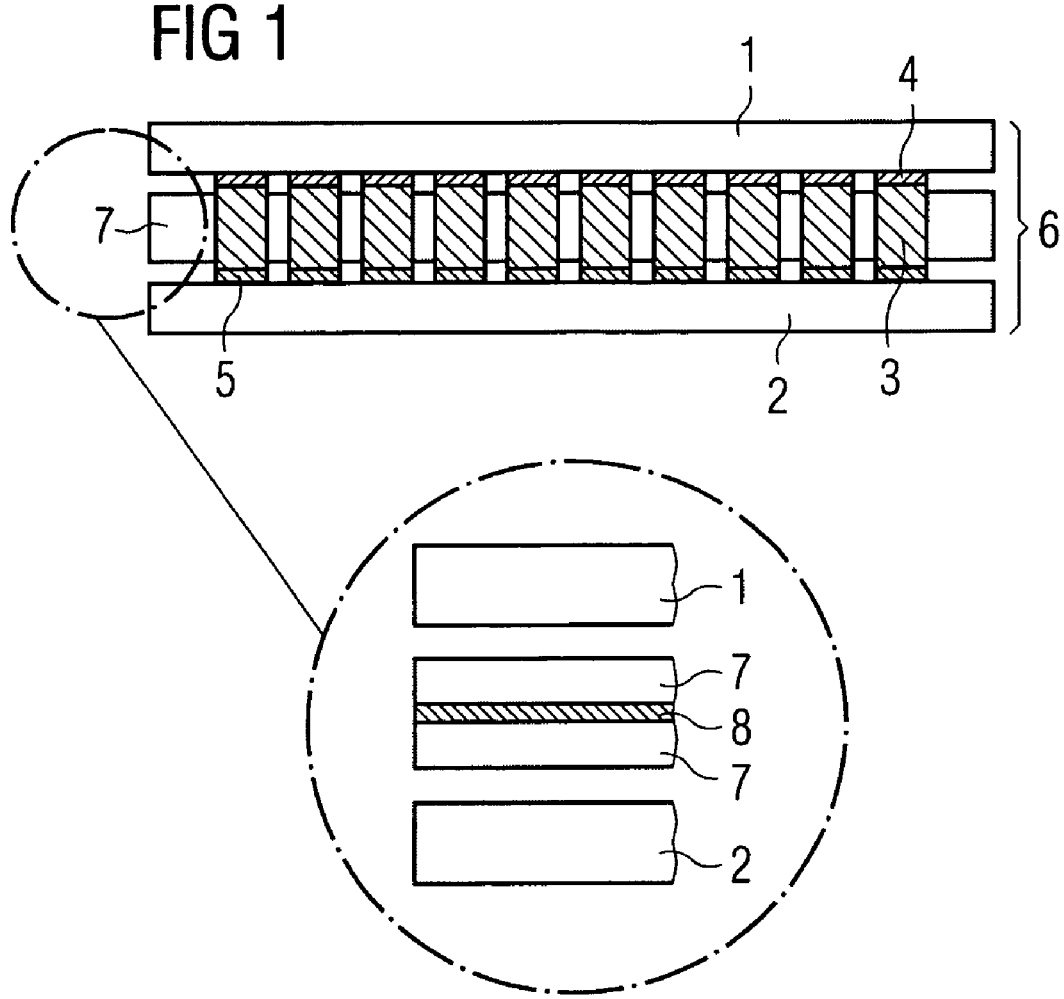
FIG. 1 shows a chip sandwich arrangement electrically and mechanically connected to one another by means of the contact elements according to a preferred embodiment of the invention, the contact elements being partly embedded in a flexible substrate.
Figure 2:
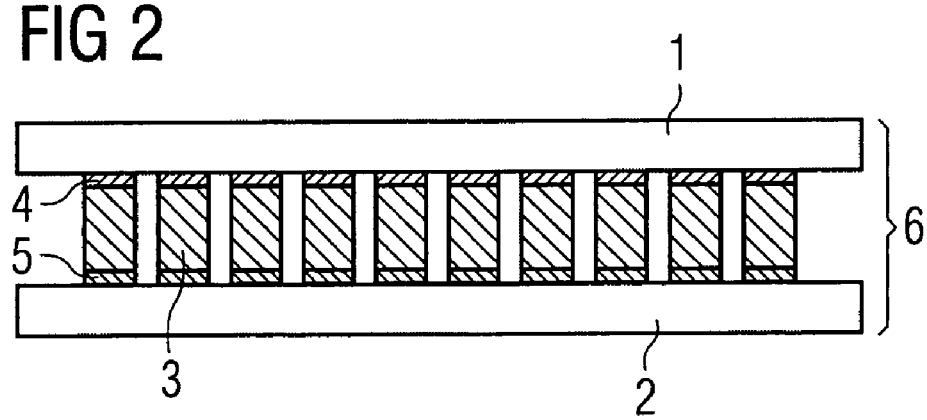
FIG. 2 shows a chip sandwich arrangement according to FIG. 1 in which the flexible substrate has been removed.

FIG. 1 illustrates an interconnection according to a preferred embodiment of the invention between two chips 1, 2 in a face-to-face arrangement. These chips 1, 2 are connected to one another by means of pin- or sleeve-shaped contact elements 3. For this purpose, the contact elements 3 are soldered to contact pads 4, 5 on the chips 1, 2, thereby creating an electrical and mechanical interconnection in the contact pads 4, 5 of the chips.

The pin- or sleeve-shaped contact elements 3 preferably ensure a shortest possible connection between the chips 1, 2 and at the same time enable a mechanically fixed composite to form a chip sandwich 6.

In order to simplify the mounting, the contact elements 3 are embedded in a flexible substrate 7, which may comprise a flexible polymer substrate, for example. In this case, the contact elements 3 are arranged in the pitch of the contact pads 4, 5 in a manner similar to an FBGA structure of the chips that are to be contact-connected to one another.

Figure 5:
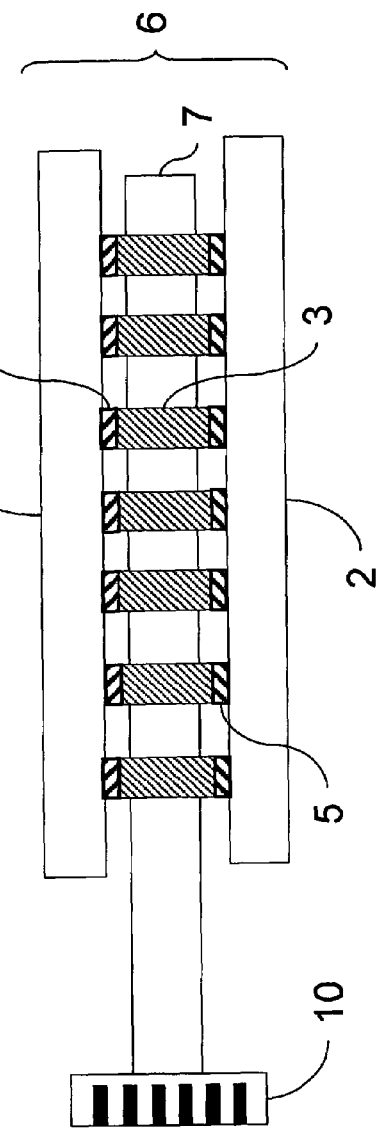
FIG. 5 shows a chip sandwich arrangement that is electrically connected to an external assembly.

Conductive tracks 8, which may be made of copper, may also be embedded in the flexible polymer substrate 7 in order to enable an electrical contact-connection to peripheral units, e.g., printed circuit boards. The Cu conductive tracks 8 are electrically connected to the corresponding contact elements 3. The flexible polymer substrate 7 with the Cu conductive tracks 8 may be used thus as a flexible printed circuit board for electrical connection to external assemblies, such as the assembly 10 illustrated in FIG. 5.

The flexible substrate 7 may also be used as a sacrificial layer in that the latter may be removed after the completion of the chip sandwich 6.

A particular feature is to be seen in the fact that the contact elements 3 may be arranged perpendicularly or else without any problems obliquely between the chips 1, 2. This makes it possible to compensate for slight positional deviations of the contacts that are to be connected to one another. Such cases may occur if chips 1, 2 of different types or from different manufacturers, e.g., memory and controller chips, are intended to be connected to one another.

In order to produce the contact elements 3 according to the preferred embodiment, microvias are introduced into the flexible substrate 7 in the pitch of the contact pads 4, 5 of the chips 1, 2. The microvias subsequently are filled with an electrically conductive material. At least the walls for the microvias are coated, as a result of which the pin- or sleeve-shaped contact elements 3 are produced.

The microvias may be introduced into the flexible substrate 7 by means of photolithography in conjunction with plasma etching. The microvias may alternatively be produced mechanically by stamping.

Figure 4:
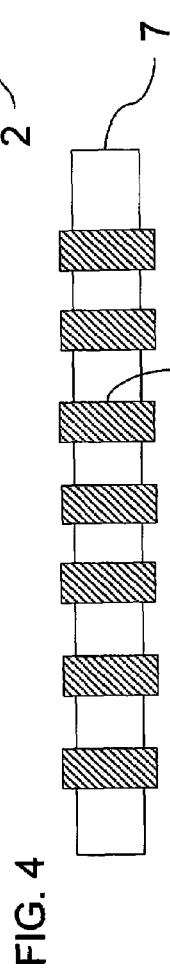
FIG. 4 shows an interposer that has been thinned.

The flexible substrate 7 is subsequently thinned by selective plasma etching on both sides in such away that the contact elements 3 project from the flexible substrate 7 on both sides, as shown in FIG. 4. The contact elements 3 are then positioned with the flexible substrate 7 between the chips 1, 2 and then soldered.

Figure 3:
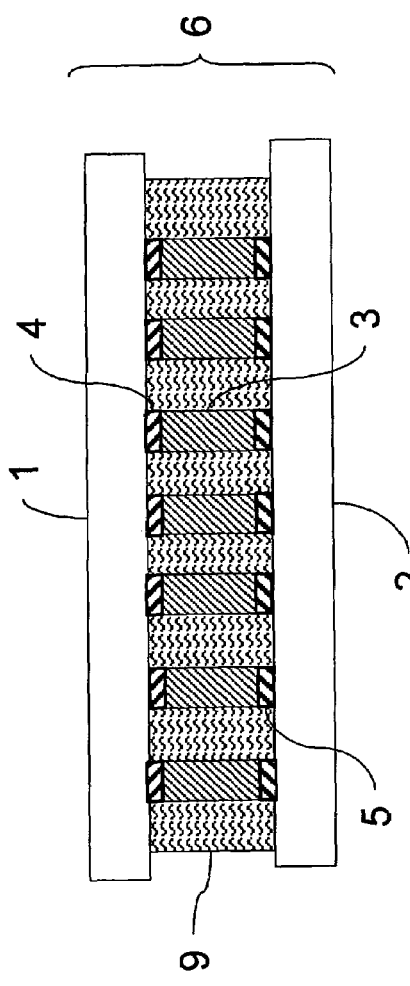
FIG. 3 shows a chip sandwich arrangement in which interspaces have been filled with a material.

Referring to FIG. 3, it is also possible to remove the flexible substrate 7 after the production of the electrical and mechanical connection between the chips 1, 2, in which case the interspace between the chips 1, 2 may subsequently be filled with a suitable corrosion-inhibiting material 9 by utilizing capillary forces.

The flexible substrate 7 may also be used as a flexible printed circuit board whose Cu conductive tracks are contact-connected during the metalization of the microvias. A connection to peripheral devices can thereby be realized in a simple manner.

What is claimed is:

1. A method for forming an electronic component, the method comprising:
   forming microvias into a flexible substrate in a pitch of contact pads of semiconductor chips;
   filling the microvias with an electrically conductive material, at least the walls of the microvias being coated so as to form pin- or sleeve-shaped contact elements;
   electrically and mechanically attaching contact pads of a first semiconductor chip to exposed contact elements on a first surface of the flexible substrate; and
   electrically and mechanically attaching contact pads of a second semiconductor chip to exposed contact elements on a second surface of the flexible substrate, the second surface being opposed to the first surface;
   removing the flexible substrate after electrically and mechanically attaching the contact pads of the first and second semiconductor chips to the contact elements; and
   after removing the flexible substrate, filling an interspace between the first and second semiconductor chips with a material.

2. The method of claim 1 wherein removing the flexible substrate comprises performing plasma etching.

3. The method of claim 1 wherein electrically and mechanically attaching contact elements comprises soldering the contact elements.

4. The method of claim 1 wherein filling an interspace between the first and second semiconductor chips comprises filling the interspace with a corrosion-inhibiting material.

5. The method of claim 4 wherein the interspace is filled by utilizing capillary forces.

6. The method of claim 1 wherein the microvias are formed in the flexible substrate by means of photolithography in conjunction with plasma etching.

7. The method of claim 1 wherein the microvias are formed in the flexible substrate mechanically by stamping.

8. The method of claim 1 wherein the flexible substrate comprises a flexible printed circuit board that includes conductive tracks that are conductively connected during metalization of the microvias.

9. The method of claim 8 wherein the conductive tracks comprise copper tracks.

10. A method of making an electronic device, the method comprising:

providing a first chip and a second chip; and electrically and mechanically connecting the second chip to the first chip, wherein a surface that includes contact pads of the first chip is facing a surface that includes contact pads of the second chip;

wherein a plurality of pin- or sleeve-shaped contact elements are arranged between the first chip and the second chip, each contact elements being attached only to a contact pad of the first chip and a contact pad of the second chip thereby creating an electrical and mechanical interconnection between the contact pads of the first and second chips wherein the contact elements are embedded obliquely in a flexible substrate, the method further comprising: removing the flexible substrate after electrically and mechanically attaching the contact pads of the first and second semiconductor chips to the contact elements; and after removing the flexible substrate, filling an interspace between the first and second semiconductor ships with a material.

11. The method of claim 10, wherein the contact elements are soldered to the contact pads.

12. The method of claim 10, wherein the flexible substrate comprises a flexible polymer material.

13. The method of claim 12, wherein the flexible substrate further comprises conductive tracks embedded therein, at least some of the contact elements being electrically connected to said tracks.

14. The method of claim 13, wherein the flexible substrate with the conductive tracks comprises a flexible printed circuit board.

15. The method of claim 14, further comprising electrically connecting the flexible printed circuit board to an external assembly.

16. The method of claim 13, wherein the conductive tracks comprise copper tracks.

17. The method of claim 12, wherein the flexible substrate is formed as a sacrificial layer, the method comprising removing the sacrificial layer.

18. The method of claim 10, wherein the contact elements are arranged in a pitch of the contact pads of the first and second chips so that the first and second chips are contact-connected through one another.

19. The method of claim 10, wherein the contact elements are arranged perpendicularly or obliquely between the first and second chips.

* * * * *